United States Patent
Downs

(10) Patent No.: US 10,395,554 B2
(45) Date of Patent: Aug. 27, 2019

(54) SCORING OF USER OPERATIONS PERFORMED ON A COMPUTER IN A COMPUTERIZED LEARNING SYSTEM

(71) Applicant: Information Systems Audit and Control Association, Inc., Rolling Meadows, IL (US)

(72) Inventor: Thomas Frank Downs, Edgewater, MD (US)

(73) Assignee: Information Systems Audit and Control Association, Inc., Rolling Meadows, IL (US)

( * ) Notice: Subject to any disclaimer, the term of this patent is extended or adjusted under 35 U.S.C. 154(b) by 89 days.

(21) Appl. No.: 15/445,620

(22) Filed: Feb. 28, 2017

(65) Prior Publication Data

US 2018/0247562 A1 Aug. 30, 2018

(51) Int. Cl.
*G09B 19/00* (2006.01)
*G09B 5/00* (2006.01)
*G09B 9/00* (2006.01)
*G09B 19/24* (2006.01)
*G06F 17/50* (2006.01)
*G09B 7/00* (2006.01)

(52) U.S. Cl.
CPC .......... *G09B 19/0053* (2013.01); *G09B 5/00* (2013.01); *G06F 17/5009* (2013.01); *G09B 7/00* (2013.01); *G09B 9/00* (2013.01); *G09B 19/24* (2013.01)

(58) Field of Classification Search
CPC . G09B 7/00; G09B 9/00; G09B 19/24; G09B 19/0053; G09B 5/00; G06F 17/5009
USPC ........................................................ 434/118
See application file for complete search history.

(56) References Cited

U.S. PATENT DOCUMENTS

| | | | | |
|---|---|---|---|---|
| 6,340,977 B1* | 1/2002 | Lui | ........................ | G06F 9/453 715/709 |
| 6,594,466 B1* | 7/2003 | Harned | .............. | G09B 19/0053 434/307 R |
| 8,250,654 B1 | 8/2012 | Kennedy et al. | | |
| 9,548,000 B2 | 1/2017 | Willingham et al. | | |
| 2003/0228560 A1* | 12/2003 | Seat | ....................... | G09B 19/00 434/219 |

(Continued)

FOREIGN PATENT DOCUMENTS

WO  WO 2014153510  9/2014

OTHER PUBLICATIONS

International Patent Application PCT/US/2018/019204, International Search Report and Written Opinion, dated Jul. 12, 2018.

*Primary Examiner* — Jack Yip
(74) *Attorney, Agent, or Firm* — Greenberg Traurig, LLP

(57) ABSTRACT

A computer and method to assess technical skills of a student undergoing education in a training course on a computer-related topic. The computer includes a plurality of computer components having functions in the topic. A training application running on the computer instructs a user of the computer to perform an exercise on the computer; and a scoring application running locally in the computer has: a configuration file; a system inspector that determines states of the computer components according to the configuration file as a result of the exercise; and a scoring engine that computes locally a score of a skill of the user related to the topic based on the states of the computer components determined by the system inspector and in accordance with the configuration file.

20 Claims, 5 Drawing Sheets

(56) References Cited

U.S. PATENT DOCUMENTS

| | | | |
|---|---|---|---|
| 2004/0029092 A1* | 2/2004 | Orr | G09B 7/02 |
| | | | 434/354 |
| 2009/0087822 A1* | 4/2009 | Stanton | G09B 5/06 |
| | | | 434/156 |
| 2009/0228253 A1* | 9/2009 | Tolone | G06Q 10/06 |
| | | | 703/6 |
| 2011/0173611 A1* | 7/2011 | Takebe | G06F 9/45545 |
| | | | 718/1 |
| 2015/0213730 A1 | 7/2015 | Brueckner et al. | |
| 2015/0243179 A1* | 8/2015 | Zaslavsky | G06Q 50/20 |
| | | | 434/327 |
| 2015/0339942 A1* | 11/2015 | Ben-Naim | G09B 7/00 |
| | | | 434/309 |
| 2016/0293036 A1* | 10/2016 | Niemi | G09B 7/077 |

\* cited by examiner

SCORING OF USER OPERATIONS PERFORMED ON A COMPUTER IN A COMPUTERIZED LEARNING SYSTEM

FIELD OF THE TECHNOLOGY

At least some embodiments disclosed herein relate to computerized education and training in general and, more particularly but not limited to, evaluation of a skill level of a user in computerized education and training.

BACKGROUND

Computer programs have been developed to provide knowledge and training related to computer systems, which can be used to improve the skills of students/trainees in areas such as cyber security, information systems governance, audit and assurance.

U.S. Pat. No. 9,548,000 discloses a scoring server configured to access the technical skills in a practical environment. A client application is used to capture all input from, and output to, a student undergoing evaluation and transmit the captured input/output activities to the scoring server, which assesses the skills of the student from the captured input/output activities.

The disclosure of the above discussed patent is herein incorporated herein by reference.

BRIEF DESCRIPTION OF THE DRAWINGS

The embodiments are illustrated by way of example and not limitation in the figures of the accompanying drawings in which like references indicate similar elements.

DETAILED DESCRIPTION

The following description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

The techniques disclosed below provide a light weight implementation of a scoring capability on a client computer without the need for a scoring server. The techniques eliminate the need for connecting a client application as a middle man to capture the input/output data and transmit the data to a scoring server. The scoring is performed locally at the computer where the exercise is performed using information collected from the computer. Thus, the need for exchanging data between the scoring server and the user computer is eliminated. As a result, the techniques improve efficiency in the use of network resources, improve the privacy of the student, trainee, or evaluatee, improve the security of the computerized training system, and reduce/eliminate the hardware and operation cost for implementing and maintaining a scoring server.

For example, the techniques disclosed below make it possible to implement the computerized training lab (e.g., for cyber security training), exercises, and/or exams on a single client computer. The performance grading can be carried out on the computer without internet connectivity and/or intranet connectivity. Thus, the techniques decentralize the scoring capability from a scoring server and implement the scoring capability on the exercise computer of the student, trainee or evaluatee.

For example, the techniques disclosed below can be used to implement a lightweight, decentralized, performance-based scoring application which enables organizations to perform rapid-response, individual skill assessment.

For example, a training application may offers computer labs, lectures, and performance-based exercises which instruct students on multiple cyber security topics, ranging from basic packet analysis to advanced hashing and backup implementation by teaching tools such as KaliLinux, Network Miner and Wireshark. A scoring application can be used to assess the skill level of the student to customize the training provided by training application, measure the improvements and progress.

Figure 1:
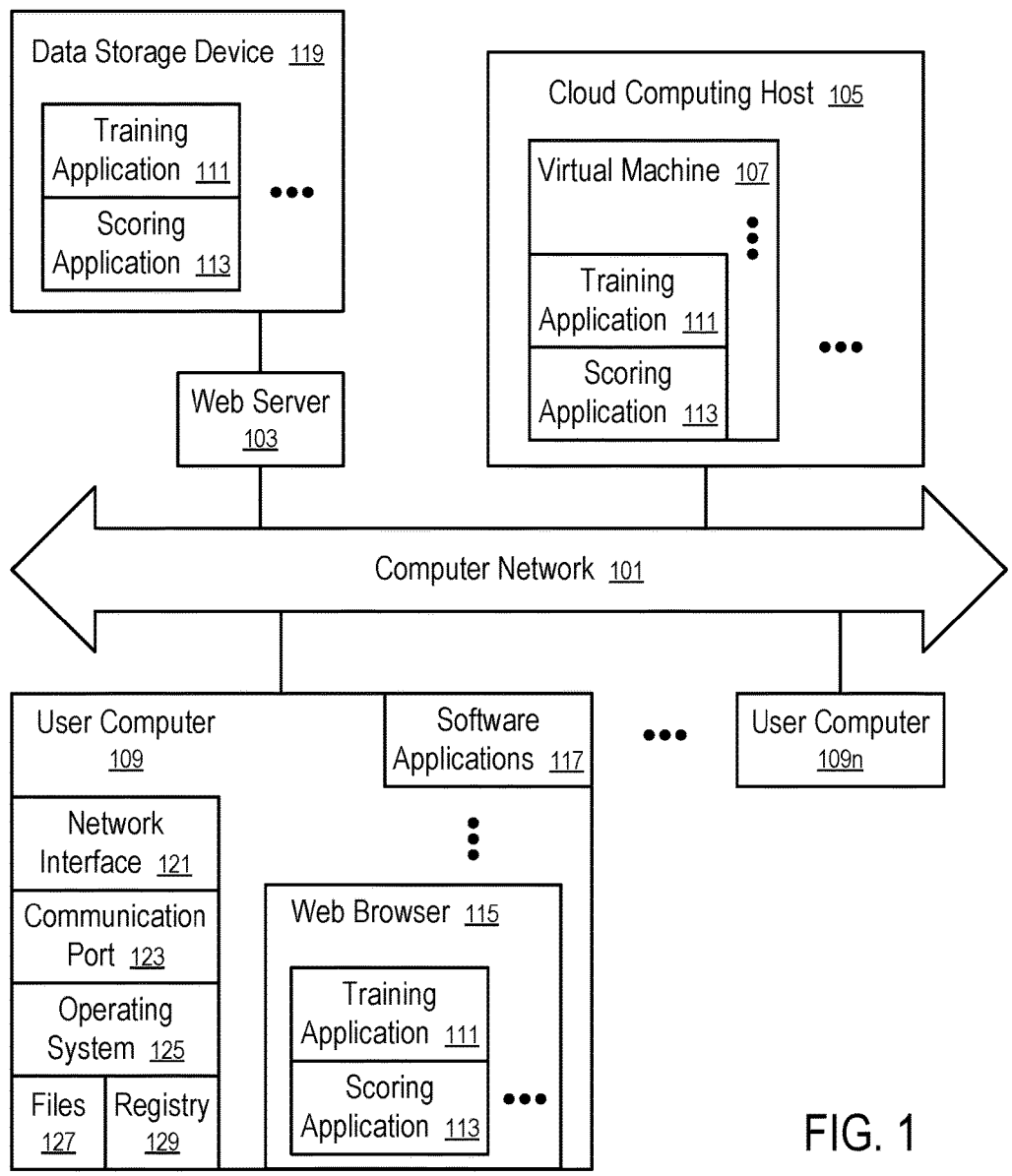
FIG. 1 shows a system in which techniques of evaluating the skill of a user can be implemented.

FIG. 1 shows a system in which techniques of evaluating the skill of a user can be implemented.

In FIG. 1, a scoring application (113) is configured in a user computer (109) that also runs a training application (111). The training application (111) and the scoring application (113) can be implemented as applications running in a web browser (115) and downloaded from the data storage device (119) of a web server (103).

Alternatively, the training application (111) and the scoring application (113) can also be stand alone software applications, or mobile applications running on mobile devices (e.g., notebook computers, tablet computers, smart phones).

In some instances, the scoring application (113) is implemented as a module of the training application such that the scoring application (113) has at least the same level of access as the training application to various components of the user computer (109), such as a network interface (121), a communication port (123), an operating system (125), files stored under the operating system (125), a registry (129) and/or other software applications (117).

The training application (111) and the scoring application (113) can also run in a virtual machine (107) hosted on a cloud computing host (105). The virtual machine (107) has components similar to the computer components (117, 121-129) of a user computer (109). The cloud computing host (105) may host multiple virtual machines (107) that may share the services of physical components as if separate physical components were independently configured only in the virtual machines. A user of the user computer (109) may access the virtual machine (107) through a computer connection over a computer network (101), such as a local area network, an internet, the Internet, etc.

The training application (111) and the scoring application (113) may be partially hosted on the web server (103) that delivers the training application (111) and the scoring application (113) to user computers (e.g., 109, ..., 109n), virtual machine (107), etc. In some instances, the training application (111) may run partially on the web server (103) in the form of a servlet. In other instances, the training application (111) is downloaded from the web server (103) and then executed on a user computer (109), or a virtual machine (107), in a mode without a need for a further connection to the web server (103).

Alternatively, the training application (111) and the scoring application (113) can be transferred to the user computer (109) via computer storage media, such as a flash drive, a CD-ROM, a DVD-ROM, etc.

In FIG. 1, when the scoring application (113) is running in the user computer (109), the scoring application (113) accesses the components (e.g., 117, and/or 121-129) of the user computer (109) that are relevant to the performance of the exercise identified by the training application (111). The scoring application (113) determines a skill level or grades the performance of an exercise by a user based on the data collected by the scoring application (113) from components (e.g., 117, and/or 121-129) of the user computer (109)

Preferably, the scoring application (113) does not communicate directly with the training application (111) to collect the inputs from the user and/or the outputs provided to the user; and the scoring application (113) does not intercept the inputs from and the outputs to the user (e.g., at an operating system level, or as a middle man between the training application (111) and the operating system (125)) for the purpose of evaluating the skill level of the user, which may create a security threat in the user computer (109) (or the virtual machine (107) when running in the virtual machine (107)). Instead, the scoring application (113) evaluates the effect of the exercise on the components of the user computer (109) to determine the skill level of the user. For example, the scoring application (113) inspects the states, and/or the changes of the states, of the components (e.g., 117, and/or 121-129) of the user computer (109) to determine the skill level of the evaluatee.

Alternatively, the training application (113) may provide certain data during the user exercise to the scoring application (113) to assist the scoring application (113) in evaluating the skill of the user. For example, the training application (113) may record a data log of user interactions with the training application and provide the data log to the scoring application (113) for scoring of an exercise.

In a further alternative, the scoring application (113) captures the input from the user to the training application (111) and the output from the training application (113) to the user to evaluate the skill of the user in performing the exercise. The scoring application (113) determines the skill level locally on the user computer (109) on which the training application (111) is running and thus avoids the need to communicate the collected information to a scoring server.

In one implementation, the training application (111) includes a user interface element to invoke the scoring application (113). After an exercise as instructed by the training application (111), the user of the training application (111) may activate the user interface element to activate the scoring application (113), which generates locally on the computer a score indicative of the skill of the user demonstrated in the exercise and presents the score to the user.

In activating the scoring application (113), the training application (111) identifies an identity of the exercise, which causes the scoring application (113) to use a configuration file specific for the exercise to compute a score based on the states of the components of the computer and/or an optional data log from the training application (111). Thus, the scoring application (113) can be configured using different configuration files for the evaluation of different exercises performed on the user computer (109).

For example, the scoring application (113) can be implemented using a script language (e.g., python) that is widely available in many computing platforms. Thus, the scoring capability can be deployed to various client computers (e.g., 109, . . . , 109*n*) and virtual machines (e.g., 107) without a need to maintain a scoring server and a constant connection for the scoring server.

Figure 2:
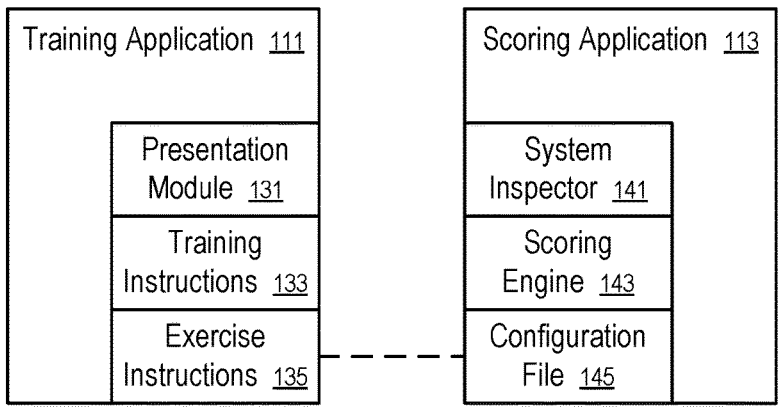
FIG. 2 shows a scoring application according to one embodiment.

FIG. 2 shows a scoring application according to one embodiment. The training application (111) and the scoring application (113) of FIG. 2 can be used, for example, in the system illustrated in FIG. 1.

In FIG. 2, the training application (111) includes a presentation module (131), training instructions (133), and exercise instructions (135).

The presentation module (131) controls the presentation of the training instructions (133) and the exercise instructions (135). The presentation can be controlled at least in part by the skill level assessment provided by the scoring application (113).

For example, before the user of the training application (111) passes a test of a particular skill, the presentation module (131) does not present training instructions (133) of skills that depend upon the particular skill.

For example, after assessing the skill levels of the user in a computer technological area that involves a set of skills, the presentation module (131) may optimize the presentation of the training instructions to efficiently improve the skill set of the user.

In general, the presentation module (131) can be implemented as a standalone software application running in the user computer (109) or the virtual machine (107), or a web application running in the web browser (115), or a servlet application running in the web server (103).

The training instructions (133) provide knowledge and illustrations to the user of the training application (111). The exercise instructions (135) instruct the user to perform certain operations on the training machine (e.g., the user computer (109) or the virtual machine (107)). The training instructions (133) and the exercise instructions (135) can be preloaded in the user computer (109) or the virtual machine (107), or loaded from the web server (103) just in time for presentation.

For example, after the presentation module (131) provides the training instructions for a lesson on a cyber-security topic, the presentation module (131) provides the exercise instructions (135) to the user, requesting the user to operate the training computer (e.g., the user computer (109) or the virtual machine (107)) to perform one or more tasks related to the cyber security topic. The operations performed by the user for the tasks may not be under the control of the training application (111). Thus, the training application (111) may not be able to directly assess the skill level of the user in performing the tasks involved in the exercise. Upon completion of the exercise, the scoring application (113) is activated to assess the skill level of the user, based at least in part of the effect of the user operations on the training computer (e.g., the user computer (109) or the virtual machine (107)). Optionally, the training application (111) may collect certain data related to the user performance of the tasks (e.g., the time durations of the operations performed for the tasks, certain inputs provided the user and/or outputs provided to the user via the training application (111)) to assist the scoring application (113) in assessing the skill level of the user in the topic. In some instances, the exercise is performed prior to an instruction session that is customized based on the skill levels of the user. In other instances, the presentation module (111) uses an iterative approach of presenting an instruction session on a topic, assessing the skill levels related to the topic, customizing and presenting a subsequent instruction session on the topic, reassessing the skill levels and the progress made via the subsequent instructions, and further customizing and presenting an instruction session on the topic to best improve the skill levels of the user.

In some instances, the presentation module (131) creates a "lab" environment as the training computer in which the exercise is conducted.

In FIG. 2, the scoring application (113) includes a system inspector (141), a score engine (143), and a configuration file (145).

The system inspector (141) determines the states of components of the training computer, such as a network interface (121), a communication port (123), the operating system (125), files (127) stored under the operation system (125), the registry (129), and/or the software applications (117). Examples of the training computer include the user computer (109) or the virtual machine (107), or the lab environment created by the presentation module (131)).

The scoring engine (143) computes a skill level based on the states of the components of the training computer, the configuration file (145), and optional input from the training application (111).

For example, the input from the training application (111) may include the identification of an exercise; and the configuration file (145) for the exercise can be retrieved for the scoring engine (143) and/or the system inspector (141). The configuration file (145) can be pre-loaded with the scoring application (113) on the user computer (109) or the virtual machine (107), or downloaded from the web server (103) when needed.

The configuration file (145) may specify which components in the training computer are relevant for the evaluation of the skill levels involved in the exercise, which causes the system inspector (141) to determine the states of the components identified in the configuration file (145).

The configuration file (145) may further specify evaluation rules on how the states of the components should be evaluated in computing a score for a skill relevant to the exercise.

Based on the evaluation rules provided in the configuration file (145) and/or the states of computer components determined by the system inspector (1410, the scoring engine (143) computes a score for a skill relevant to the exercise.

The scoring application (113) may present the score directly to the user, or indirectly via the training application (111); and the training application (111) may used the score to customize the training instructions (133) and the exercise instructions (135).

In some instances, the system inspector (141) and the scoring engine (143) are bundled in the training application (111) for execution on the training computer; and the configuration file (145) for a specific exercise is downloaded from the web server (103) when needed.

In further instances, the training application (111) and the scoring application (113) are bundled as a package, including the applicable configuration files (e.g., 145). Thus, once the package is installed on a training computer, further network connection to a server computer (e.g., the web server (103)) is not necessary. The training application (111) and the scoring application (113) may run on the training computer without any network connection.

Figure 3:
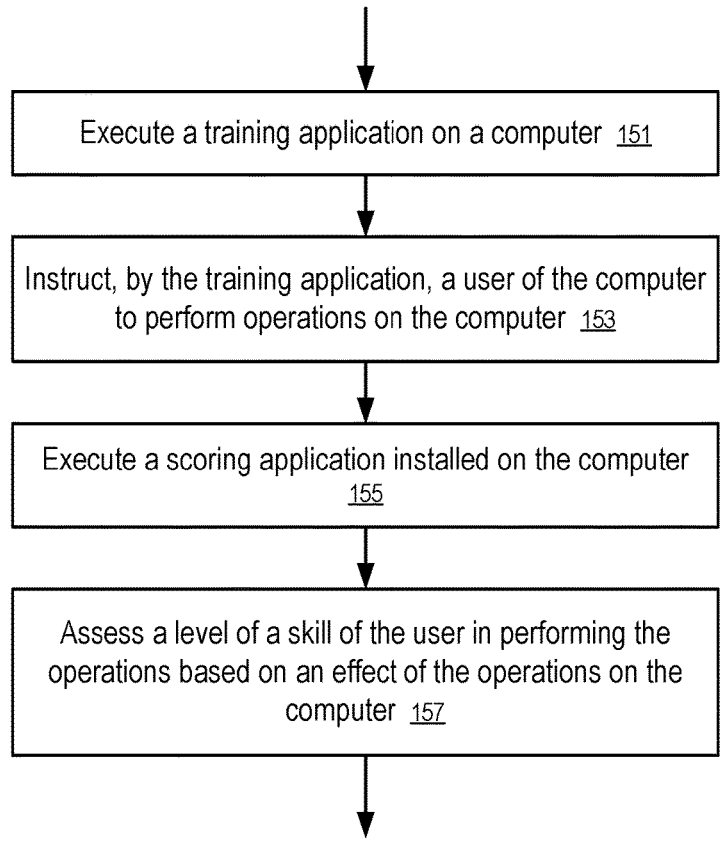
FIG. 3 shows a method to assess the level of a skill of a user according to one embodiment.

FIG. 3 shows a method to assess the level of a skill of a user according to one embodiment. For example, the method of FIG. 3 can be implemented via the training application (111) and the scoring application (113) of FIG. 2 running the system of FIG. 1.

In FIG. 3, a computer (e.g., the user computer (109) or the virtual machine (107) illustrated in FIG. 1) executes (151) a training application (111), which instructs (153), a user of the computer to perform operations on the computer as an exercise in a computer-related topic. The computer also executes (155) a scoring application (113) installed therein on the computer. The scoring application (113) assesses (157) a level of a skill of the user in performing the operations based on an effect of the operations on the computer.

For example, the system inspector (141) of the scoring application (113) interrogates or inspects, independently from the operations of the training application (111), the states and operations of the computer components (e.g., 117, 121-129) to determine whether the computer components (e.g., 117, 121-129) are operating in a way consistent with the desirable and/or correct operations performed for the exercise. When the states and operations of the computer components are desirable and/or correct in accordance with the requirements of the exercise, a high score is computed. When some of the states and operations of the computer components are undesirable and/or incorrect in view of the requirements of the exercise, the low score is computed.

Figure 4:
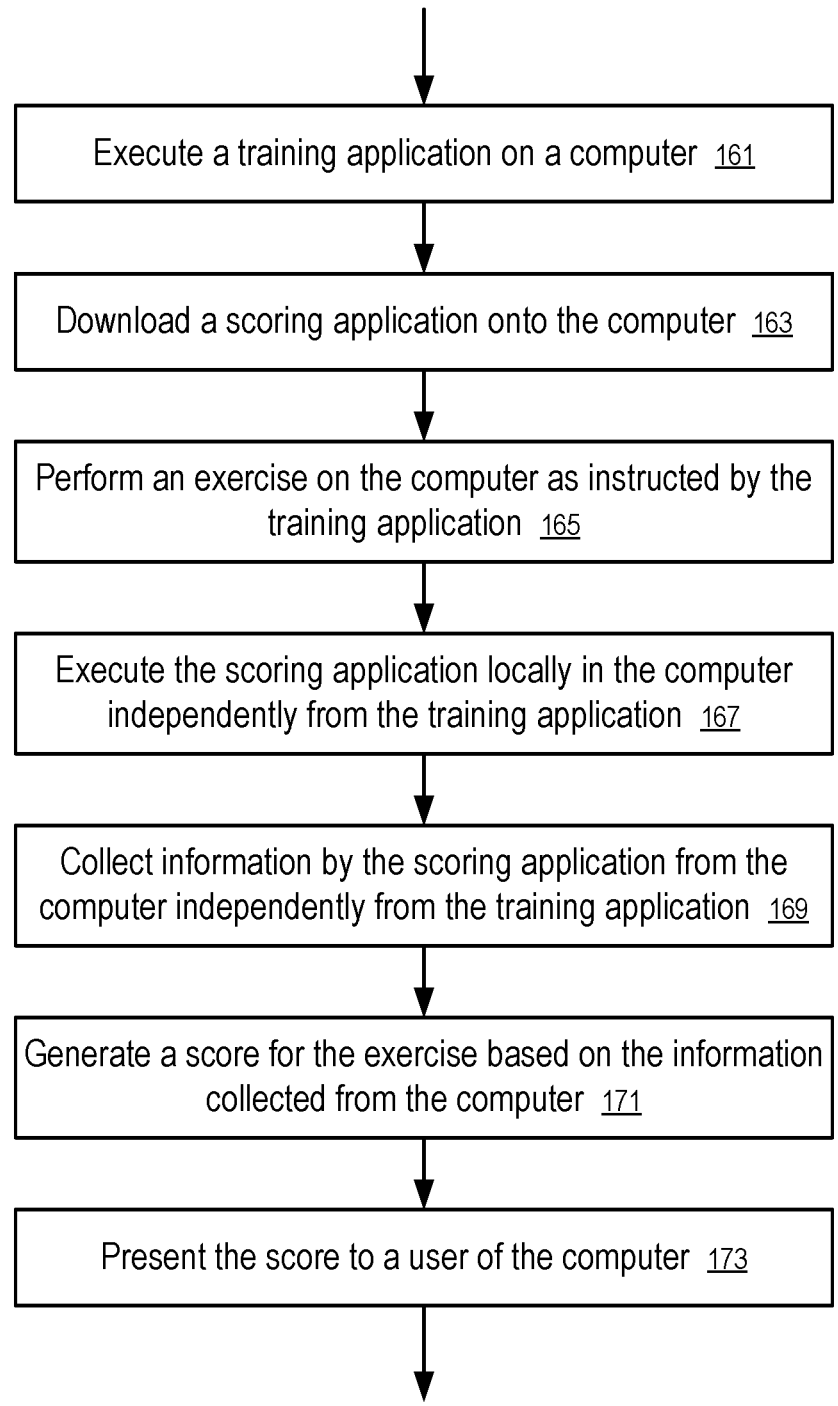
FIG. 4 shows a detailed method to assess the level of a skill of a user according to one embodiment.

FIG. 4 shows a detailed method to assess the level of a skill of a user according to one embodiment. For example, the method of FIG. 4 can be implemented via the training application (111) and the scoring application (113) of FIG. 2 running the system of FIG. 1.

In FIG. 4, a training computer (e.g., the user computer (109) or the virtual machine (107) illustrated in FIG. 1) executes (161) a training application (111) and downloads (163) a scoring application (113) onto the computer (or part of the scoring application (113), such as the configuration file (145) of the scoring application (113)).

After a user of the training application performs (165) an exercise on the training computer as instructed by the training application (111), the training computer executes (167) the scoring application (143) locally in the computer, independently from the training application (111), to collect (169) information from the training computer. The scoring application (113) locally generates (171) a score for the exercise based on the information collected from the computer without uploading performance information of the user from the training computer to a scoring server.

The score is locally presented (173) to the user of the training computer by the scoring application (113) or by the training application (111). Optionally, the training application (111) may use the score provided by the scoring application (113) to customize subsequent training for the user.

Figure 5:
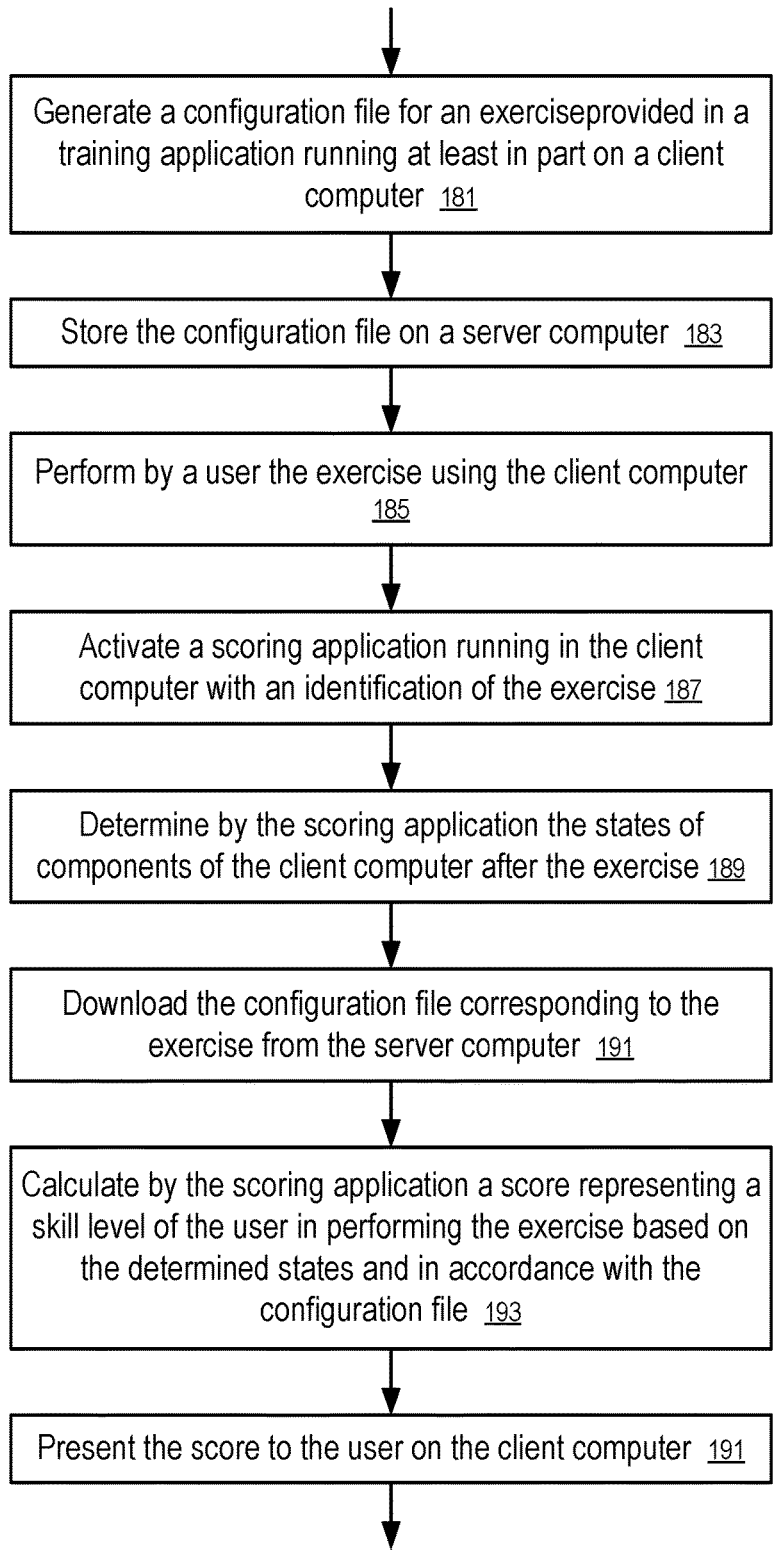
FIG. 5 shows a further detailed method to assess the level of a skill of a user according to one embodiment.

FIG. 5 shows a further detailed method to assess the level of a skill of a user according to one embodiment. For example, the method of FIG. 4 can be implemented via the training application (111) and the scoring application (113) of FIG. 2 running the system of FIG. 1.

In FIG. 5, a configuration file (145) is generated (181) for an exercise provided in a training application (111) running at least in part on a client computer (e.g., the user computer (109) or the virtual machine (107) illustrated in FIG. 1). The configuration file (145) is stored (183) on a server computer (e.g., the web server (103) with its data storage device (119) illustrated in FIG. 1). The training application (111) may be partially running on the server computer, or running completely on the client computer.

After the user of the training application (111) performs (185) the exercise using the client computer, a scoring application (113) running in the client computer is activated (187) with an identification of the exercise. For example, a user interface element of the training application (111) can be selected by the user to activate the scoring application (113) for the exercise.

The scoring application (113) determines (189) the states of components of the client computer after the exercise, downloads (191) the configuration file (145) corresponding to the exercise from the server computer, and calculates (193) a score representing a skill level of the user in performing the exercise based on the determined states and in accordance with the configuration file. The downloading of the configuration file (145) can be performed just in time for the calculation of the score after the activation of the scoring application (113), or performed ahead of the activation such that it is not necessary to have a network connection to the server computer upon the activation. For example, multiple configurations for a set of exercises of the training application can be downloaded as a part of the training application; and upon activation of the scoring application (113), a configuration file for the current exercise is selected and used in the calculation of the score.

The score can be presented (191) to the user on the client computer via the training application (111) or the scoring application (113).

The present disclosure includes methods to assess computer-related skills, computers adapted to perform the methods, and non-transitory computer readable media storing instructions which when executed on a computer causes the computer to perform the methods.

In one aspect, a method to assess technical skills of a student undergoing education in a training course on a computer-related topic, includes: providing a scoring application (113) running in a computer (e.g., 109, 107) having a plurality of computer components (e.g., 117, 121-129) that have functions in the topic, where a training application (111) instructs a user of the computer to perform an exercise on the computer. The scoring application has: a configuration file (145); a system inspector (141); and a scoring engine (143). In response to an activation of the scoring application (113), the system inspector (141) determines states of the computer components according to the configuration file (145) as a result of the exercise and computes, locally on the computer, a score of a skill of the user related to the topic, based on the states of the computer components determined by the system inspector (141) and in accordance with the configuration file (145).

Preferably, the states of the computer components are determined by the system inspector without going through the training application. More preferably, the states of the computer components are identified by the system inspector independently from operations of the training application. More preferably, the states of the computer components are identified by the system inspector without intercepting inputs from the user during the exercise and/or intercepting outputs to the user during the exercise. The score can be determined by the scoring application (113) locally on the computer without transferring, to a remote server separate from the computer, inputs provided in the exercise from the user or outputs provided in the exercise to the user. Thus, the privacy of the user as well as the network resource usage can be improved.

Optionally, the scoring application (113) downloads the configuration file (145) from a web server (103) in response to an identification of the exercise from the training application (111). For example, the scoring engine (143) computes the score of the skill of the user in response to an activation of the scoring application (113) activated after the exercise; and the activation causes the training application (111) to provide the identification of the exercise to the scoring application (113) for the download.

Optionally, the score is determined based on effects of the exercise on operations of the computer components, such as a network interface (121), a communication port (123), or other hardware or software components of the computer.

Optionally, the configuration file (145) identifies the plurality of computer components relevant for the score; and the system inspector (141) interrogates the computer components identified in the configuration file (145) to determine the states of the computer components.

Optionally, the configuration file (145) identifies evaluation rules based on which the score of the skill is computed by the scoring engine (143) from the states of the computer components.

The scoring application (113) can also be used with other types of applications that have the exercise instructions (135). For example, the training instructions (133) of the training application (111) may be omitted in some instances to evaluate the technical skills of the user without giving a lesson or course on the topic. In other instances, the training instructions (133) of the training application (111) may be replaced with relevant modules for recruiting the user for employment, assessing the skill level of the user at work for task assignment, promotion, etc.

Figure 6:
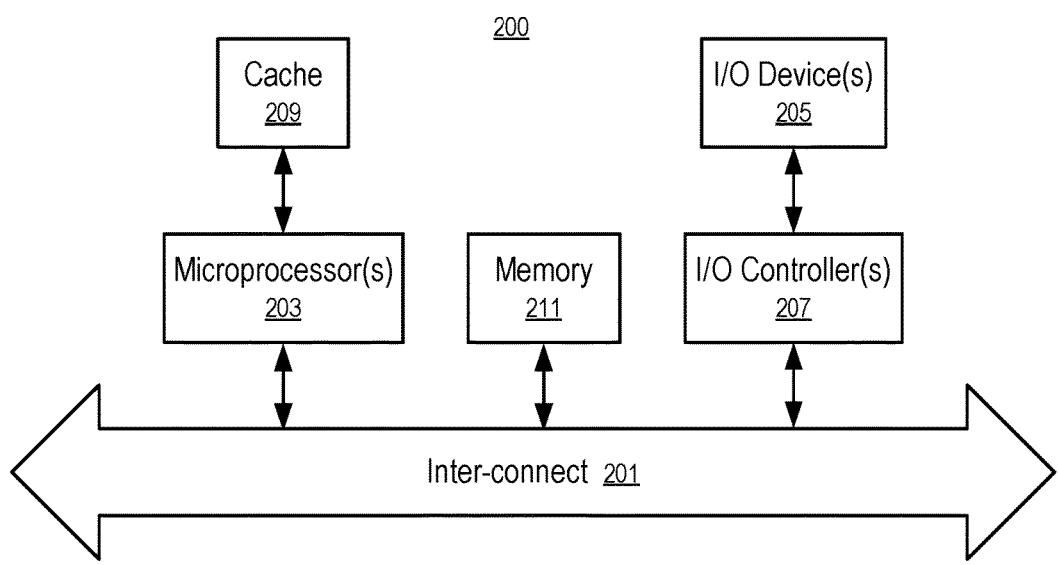
FIG. 6 shows a data processing system on which the methods of the present disclosure can be implemented.

The user computer (109 or 109n), the web server (103) and its data storage device (119), and/or the cloud computing host (105) can be implemented using one or more data processing systems illustrated in FIG. 6.

The present disclosure includes the methods discussed above, computing apparatuses configured to perform methods, and computer storage media storing instructions which when executed on the computing apparatuses causes the computing apparatuses to perform the methods.

FIG. 6 shows a data processing system on which the methods of the present disclosure can be implemented. While FIG. 6 illustrates various components of a computer system, it is not intended to represent any particular architecture or manner of interconnecting the components. One embodiment may use other systems that have fewer or more components than those shown in FIG. 6.

In FIG. 6, the data processing system (200) includes an inter-connect (201) (e.g., bus and system core logic), which interconnects a microprocessor(s) (203) and memory (211). The microprocessor (203) is coupled to cache memory (209) in the example of FIG. 6.

In one embodiment, the inter-connect (201) interconnects the microprocessor(s) (203) and the memory (211) together and also interconnects them to input/output (I/O) device(s) (205) via I/O controller(s) (207). I/O devices (205) may include a display device and/or peripheral devices, such as mice, keyboards, modems, network interfaces, printers, scanners, video cameras and other devices known in the art. In one embodiment, when the data processing system is a server system, some of the I/O devices (205), such as printers, scanners, mice, and/or keyboards, are optional.

In one embodiment, the inter-connect (201) includes one or more buses connected to one another through various bridges, controllers and/or adapters. In one embodiment the I/O controllers (207) include a USB (Universal Serial Bus) adapter for controlling USB peripherals, and/or an IEEE-1394 bus adapter for controlling IEEE-1394 peripherals.

In one embodiment, the memory (211) includes one or more of: ROM (Read Only Memory), volatile RAM (Random Access Memory), and non-volatile memory, such as hard drive, flash memory, etc.

Volatile RAM is typically implemented as dynamic RAM (DRAM) which requires power continually in order to refresh or maintain the data in the memory. Non-volatile memory is typically a magnetic hard drive, a magnetic optical drive, an optical drive (e.g., a DVD RAM), or other type of memory system which maintains data even after power is removed from the system. The non-volatile memory may also be a random access memory.

The non-volatile memory can be a local device coupled directly to the rest of the components in the data processing system. A non-volatile memory that is remote from the system, such as a network storage device coupled to the data processing system through a network interface such as a modem or Ethernet interface, can also be used.

In this description, some functions and operations are described as being performed by or caused by software code to simplify description. However, such expressions are also used to specify that the functions result from execution of the code/instructions by a processor, such as a microprocessor.

Alternatively, or in combination, the functions and operations as described here can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While one embodiment can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically include one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a data processing system causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to recordable and non-recordable type media such as volatile and non-volatile memory devices, read only memory (ROM), random access memory (RAM), flash memory devices, floppy and other removable disks, magnetic disk storage media, optical storage media (e.g., Compact Disk Read-Only Memory (CD ROM), Digital Versatile Disks (DVDs), etc.), among others. The computer-readable media may store the instructions.

The instructions may also be embodied in digital and analog communication links for electrical, optical, acoustical or other forms of propagated signals, such as carrier waves, infrared signals, digital signals, etc. However, propagated signals, such as carrier waves, infrared signals, digital signals, etc. are not tangible machine readable medium and are not configured to store instructions.

In general, a machine readable medium includes any mechanism that provides (i.e., stores and/or transmits) information in a form accessible by a machine (e.g., a computer, network device, personal digital assistant, manufacturing tool, any device with a set of one or more processors, etc.).

In various embodiments, hardwired circuitry may be used in combination with software instructions to implement the techniques. Thus, the techniques are neither limited to any specific combination of hardware circuitry and software nor to any particular source for the instructions executed by the data processing system.

Other Aspects

The description and drawings are illustrative and are not to be construed as limiting. The present disclosure is illustrative of inventive features to enable a person skilled in the art to make and use the techniques. Various features, as described herein, should be used in compliance with all current and future rules, laws and regulations related to privacy, security, permission, consent, authorization, and others. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

The use of headings herein is merely provided for ease of reference, and shall not be interpreted in any way to limit this disclosure or the following claims.

Reference to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, and are not necessarily all referring to separate or alternative embodiments mutually exclusive of other embodiments. Moreover, various features are described which may be exhibited by one embodiment and not by others. Similarly, various requirements are described which may be requirements for one embodiment but not other embodiments. Unless excluded by explicit description and/or apparent incompatibility, any combination of various features described in this description is also included here. For example, the features described above in connection with "in one embodiment" or "in some embodiments" can be all optionally included in one implementation, except where the dependency of certain features on other features, as apparent from the description, may limit the options of excluding selected features from the implementation, and incompatibility of certain features with other features, as apparent from the description, may limit the options of including selected features together in the implementation.

The disclosures of the above discussed patent documents are hereby incorporated herein by reference.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A computer to assess technical skills of a student undergoing education in a training course on a computer-related topic, the computer comprising:
   a plurality of computer components having functions in the topic, wherein the computer components include a network interface, a communication port and a registry; and
      wherein a training application teaches a user of the computer the topic on operations having impact on the computer components, including the network interface, the communication port and the register, and instructs user of the computer to perform on the computer an exercise that changes operations of the computer components, including operations of the network interface, the communication port and the registry, and wherein the plurality of computer components are not controlled by the training application; and
   a scoring application running in the computer, wherein the scoring application includes:
      a configuration file;
      a system inspector that determines states of the computer components, including the states of the network interface, the communication port, and the register, according to the configuration file as a result of the exercise; and
      a scoring engine that computes locally a score of a skill of the user related to the topic based on the states of the computer components, including the states of the network interface, the communication port, and the register, determined by the system inspector and in accordance with the configuration file, wherein the scoring application downloads the configuration file from a web server in response to an identification of the exercise from the training application.

2. The computer of claim 1, wherein the states of the computer components are determined by the system inspector without going through the training application.

3. The computer of claim 2, wherein the states of the computer components are identified by the system inspector independently from operations of the training application.

4. The computer of claim 3, wherein the states of the computer components are identified by the system inspector without intercepting inputs from the user during the exercise.

5. The computer of claim 3, wherein the states of the computer components are identified by the system inspector without intercepting outputs to the user during the exercise.

6. The computer of claim 3, wherein the score is determined by the scoring application locally on the computer without transferring, to a remote server separate from the computer, inputs provided in the exercise from the user or outputs provided in the exercise to the user.

7. The computer of claim 1, wherein the scoring engine computes the score of the skill of the user in response to an activation of the scoring application after the exercise; and the activation causes the training application to provide the identification of the exercise to the scoring application.

8. The computer of claim 7, wherein the score is determined based on effects of the exercise on operations of the computer components.

9. The computer of claim 8, wherein the configuration file identifies the plurality of computer components; and the system inspector interrogates the computer components identified in the configuration file to determine the states of the computer components.

10. The computer of claim 8, wherein the configuration file identifies evaluation rules based on which the score of the skill is computed by the scoring engine from the states of the computer components.

11. A method implemented in a computer to assess technical skills of a student undergoing education in a training course on a computer-related topic, the method comprising:
   providing, in the computer, a plurality of computer components having functions in the topic, wherein the computer components include a network interface, a communication port and a registry; and wherein a training application teaches a user of the computer the topic on operations having impact on the computer components, including the network interface, the communication port and the register, and instructs user of the computer to perform on the computer an exercise that changes operations of the computer components, including operations of the network interface, the communication port and the registry, and wherein the plurality of computer components are not controlled by the training application; and
   running a scoring application in the computer, wherein the scoring application includes:
      a system inspector; and
      a scoring engine;
   downloading, by the scoring application running in the computer, a configuration file from a web server, in response to an identification of the exercise from the training application;
   determining, by the system inspector, states of the computer components, including the states of the network interface, the communication port, and the register, according to the configuration file as a result of the exercise; and
   computing, locally by the scoring engine, a score of a skill of the user related to the topic based on the states of the computer components, including the states of the network interface, the communication port, and the register, determined by the system inspector and in accordance with the configuration file.

12. The method of claim 11, wherein the states of the computer components are determined by the system inspector without going through the training application.

13. The method of claim 12, wherein the states of the computer components are identified by the system inspector independently from operations of the training application.

14. The method of claim 13, wherein the states of the computer components are identified by the system inspector without intercepting inputs from the user during the exercise.

15. The method of claim 13, wherein the states of the computer components are identified by the system inspector without intercepting outputs to the user during the exercise.

16. The method of claim 13, wherein the score is determined by the scoring application locally on the computer without transferring, to a remote server separate from the computer, inputs provided in the exercise from the user or outputs provided in the exercise to the user.

17. The method of claim 11, wherein the scoring engine computes the score of the skill of the user in response to an activation of the scoring application after the exercise; and the activation causes the training application to provide the identification of the exercise to the scoring application.

18. The method of claim 17, wherein the score is determined based on effects of the exercise on operations of the computer components.

19. The method of claim 18, wherein the configuration file identifies the plurality of computer components; and the system inspector interrogates the computer components identified in the configuration file to determine the states of the computer components.

20. The method of claim 18, wherein the configuration file identifies evaluation rules based on which the score of the skill is computed by the scoring engine from the states of the computer components.

* * * * *